United States Patent [19]

Claiborne, Jr.

[11] 4,005,318
[45] Jan. 25, 1977

[54] ELASTIC WAVE DETECTOR

[75] Inventor: Lewis T. Claiborne, Jr., Dallas, Tex.

[73] Assignee: Texas Instruments Incorporated, Dallas, Tex.

[22] Filed: Nov. 4, 1971

[21] Appl. No.: 195,726

Related U.S. Application Data

[63] Continuation of Ser. No. 856,953, Sept. 11, 1969, abandoned.

[52] U.S. Cl. .............................. 307/304; 235/181; 333/30 R; 333/70 T; 357/23; 357/26; 357/41
[51] Int. Cl.² .................. H01L 27/20; H01L 29/78
[58] Field of Search ............. 329/198; 340/146.3 Z, 340/146.2; 333/30 R, 70 T; 330/5.5; 235/181

[56] References Cited
UNITED STATES PATENTS

| 3,215,981 | 11/1965 | Golay | 340/143.6 Z |
|---|---|---|---|
| 3,360,749 | 12/1967 | Sittig | 333/30 |
| 3,479,572 | 11/1969 | Pokorny | 317/235 |
| 3,609,252 | 9/1971 | Broce et al. | 317/235 B |

Primary Examiner—William D. Larkins
Attorney, Agent, or Firm—Harold Levine; James T. Comfort; William E. Hiller

[57] ABSTRACT

Elastic waves propagating at the surface of a solid may be detected by a change in resistance of a charge inversion region caused by stresses produced by the propagating wave. A field-effect transistor having drain and source regions and a gate electrode is biased through the gate electrode to produce a charge inversion between the drain and source regions. A change in resistance of the charge inversion layer as a result of a stress produced by surface wave (piezoresistance effect) varies the current flow in a circuit connected to the drain region. The varying current flow in the external circuit is related to the propagating wave. To generate a surface wave in a solid, a bulk wave convertor may be employed.

3 Claims, 9 Drawing Figures

INVENTOR:
LEWIS T. CLAIBORNE, JR.

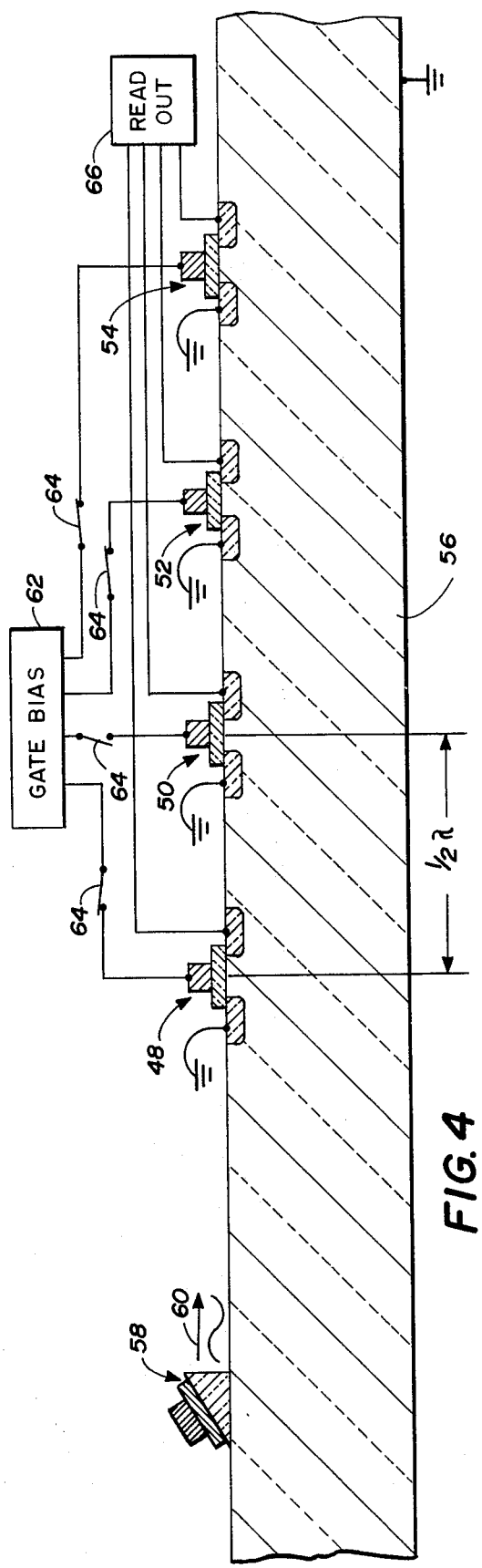
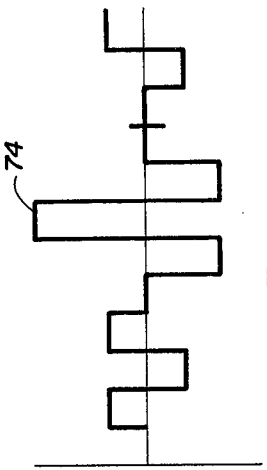
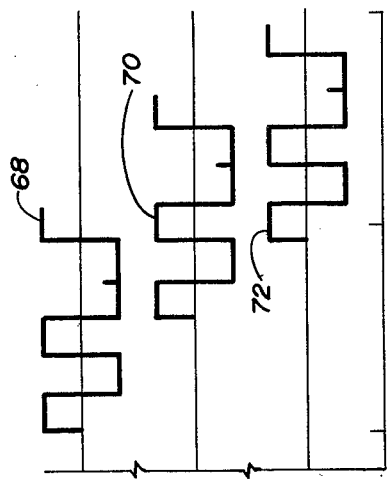
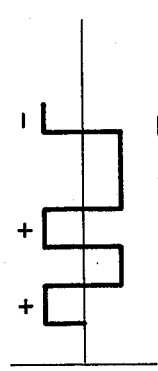
INVENTOR:
LEWIS T. CLAIBORNE, JR.

INVENTOR:
LEWIS T. CLAIBORNE, JR.

ELASTIC WAVE DETECTOR

This is a continuation of application Ser. No. 856,953, filed Sept. 11, 1969, now abandoned.

This invention relates to elastic wave detection, and more particularly to elastic wave detection by the piezoresistance effect on a charge inversion region.

Recently, studies have been completed and investigations conducted to show that bulk acoustic waves propagating in solids have application as delay lines in communications systems, radar systems and data processing systems. Efforts have also been directed toward the electro-acoustic properties of compound semi-conductors; in particular, investigation and laboratory experimentation has been conducted on bulk acoustic amplifiers and oscillators. Now, effort is being expended in studying the application of surface waves in various device configurations including surface wave transducers, delay lines, decoders, and surface wave amplifiers. Advances, such as improved compound semiconductor materials, heteromaterial systems, integrated circuits and piezoresistance phenomena, combined with surface wave phenomena, has lead to many interesting and useful devices.

The theory of elastic waves propagation at the surface of a solid has not to date been thoroughly developed, primarily because of the complexity of the surface wave phenomena. Several types of elastic waves traveling along the surface of the solid have, however, been identified; these include Rayleigh waves, Love waves, and guided waves. Of these several types of elastic waves, only the Rayleigh wave will be considered; however, the invention is applicable to the detection of any elastic wave having particle displacement at the surface of a solid. A Rayleigh wave is purely surface wave traveling parallel to a stress-free, plane boundary of an infinite, isotropic, elastic solid. Such waves can be thought of as "clinging" to a region near a free surface and travel along parallel to the surface but damping out exponentially in a direction transverse to the free surface. Thus, most of the energy of a Rayleigh wave is contained within a wavelength of the surface; therefore, the designation as a surface wave is apt. It has also been established by numerous investigators that a surface wave traveling through an elastic solid produces periodic stresses in the solid that varies in accordance with the propagated wave.

In accordance with the present invention, an elastic wave propagating at the surface of a substrate causes stress points to be produced. As the wave propagates through a charge inversion region, the piezoresistance effect produces an output signal in a circuit connected to the inversion region. The output signal being related to the traveling elastic wave through the stress pattern. Typically, an elastic wave may be generated in a substrate by means of a bulk wave convertor which has a bulk wave applied thereto.

In accordance with a more specific embodiment of this invention, a wedge-shaped bulk wave convertor converts a bulk wave into a surface wave that propagates through a substrate. The generated surface wave propagates through an inversion layer (charge inversion region) formed by biasing the gate electrode of a field-effect transistor formed in the substrate. By grounding the source region of the field-effect transistor and connecting the drain region to an external circuit, a piezoresistance change in the inversion layer caused by the propagating wave front produces a current change in the circuit connected to the drain region. Typically, the field-effect transistor may be formed by metal-oxide-semiconductor techniques.

By arranging an array of such elastic wave transducers, as described above, in a pre-established pattern, a code-carrying elastic wave may be decoded. Code pulses are converted into a wave that propagates through a substrate in a manner such that the code-carrying wave travels sequentially through the pattern of surface wave transducers. When the traveling coded wave reaches a pre-established position with respect to the array of transducers, the code therein may be read from the output of selected transducers of the array.

An object of the present invention is to provide an elastic wave detector. Another object of this invention is to detect a propagating surface wave by means of the piezoresistance change in a charge inversion region. A still further object of this invention is to provide surface wave detection by means of a field-effect transistor. A still further object of this invention is to provide for surface wave decoding by a pattern of charge inversion regions formed in a substrate through which the surface wave propagates. Still another object of this invention is to provide for decoding a code-carrying surface wave by means of selected patterns of field-effect transistors.

A more complete understanding of the invention and its advantages will be apparent from the specification and claims and from the accompanying drawings illustrative of the invention.

Referring to the drawings:

FIG. 4 is an illustration of a portion of a surface wave decoder employing a pattern of MOS field-effect transistors;

FIG. 5 is a series of waveforms illustrating the decoding sequence of the pattern illustrated in FIG. 4;

Figure 1:
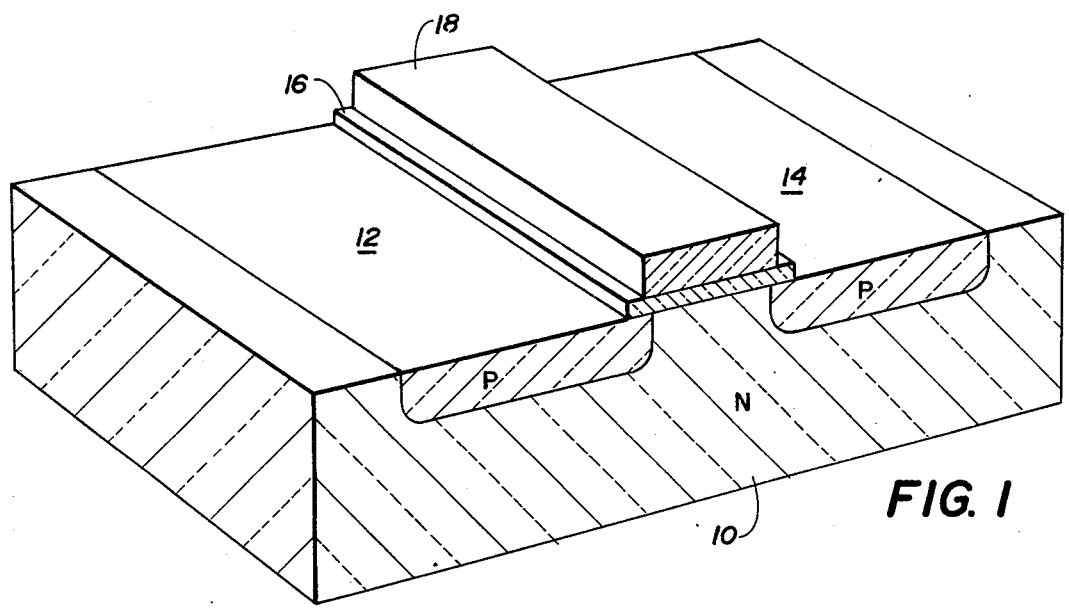
FIG. 1 is a pictorial view of a metal-oxide-semiconductor (MOS) field-effect transistor.

Referring to FIG. 1, there is shown a metal-oxide-semiconductor field-effect transistor (MOSFET) including an N-type silicon substrate 10 having P-type diffused areas 12 and 14 formed therein to outline source and drain regions, respectively. A silicon dioxide layer 16 is formed over the gap between the regions 12 and 14 and extends partially over each of these regions. Over-laying the oxide layer 16, a metal region 18 is deposited to form a gate electrode. A metal-oxide-semiconductor field-effect transistor (MOSFET) of the type shown, may be considered as a semiconductor current path whose conductance is controlled by applying an electric field perpendicular to the current. A detailed explanation of the operation of MOS field-effect transistors may be found in any one of a number of texts. For an understanding of the present invention, only the process by which an inversion layer is generated between the regions 12 and 14 will be described.

Figure 2:
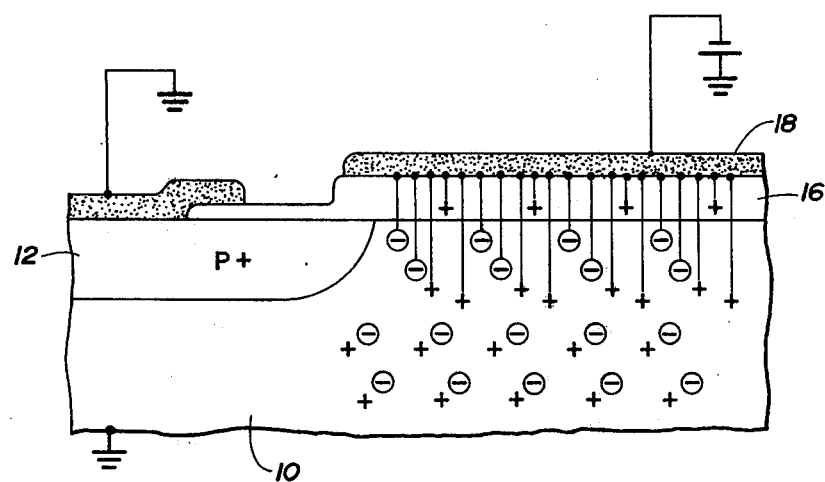
FIG. 2 is a portion of a cross section of a field-effect transistor illustrating the charge inversion region generated by biasing the gate electrode.

With the source region 12 grounded and the gate electrode 18 connected to a DC supply source, referring to FIG. 2, the gate voltage controls the charge in the channel region at the surface of a substrate 10 between the regions 12 and 14 immediately beneath the layer 16. A negative bias applied to the gate electrode 18 modifies conditions within the silicon. As the gate accumulates a negative charge, free electrons that are present in the N-type silicon substrate 10 are repelled, forming a depletion region at the substrate surface beneath the layer 16. Once sufficient depletion has occured, additional gate bias attracts positive mobile holes to the substrate surface. When enough holes have accumulated in the channel area, the substrate surface changes from electron dominated to hole dominated and is said to have "inverted". Thus, the situation now exists where the two P-type diffused regions 12 and 14 are connected together by a P-type inversion layer.

In the usual application of a field-effect transistor of the type illustrated and described, a signal on the gate electrode 18 modulates the number of carriers within the channel region, so that the gate, in effect, controls current flowing in the channel between the regions 12 and 14. It can also be shown that any modulation of the number of carriers within the channel between the regions 12 and 14 will control current in the channel.

Another technique for modulating the conductivity within the inversion region between the source 12 and the drain 14 is by means of applying a stress to the inversion layer, that is, a piezoresistance change. The piezoresistance effect is a change in resistance of a conductor when it is subjected to a stress. The effect was discovered in semiconductors many years ago. Investigators of the piezoresistance phenomena have found that a change in resistance of a semiconductor (silicon or germanium) may be generated by carrier mobility variation with applied stress, thereby leading to variations in bulk resistance.

The piezoresistance effect is also exhibited in the inversion layer between the regions 12 and 14 in the P-channel enhancement mode MOS field-effect transistor, illustrated in FIG. 1. The gauge factor [G] for the inversion layer of a MOSFET is given by the expression:

$$G = \pi Y,$$

where
Y = Young's Modulus, and
$\pi$ = the inversion layer piezoresistance coefficient.
The inversion layer piezoresistance coefficient is in turn defined by the expression:

$$\pi = (1/X)\Delta\rho/\rho,$$

where
X = the axial stress,
$\Delta\rho$ = change in channel resistivity, and
$\rho$ = channel resistivity in a prestressed condition.
Representative measured values of piezoresistance constants are given in Table I.

TABLE I

Figure 3:
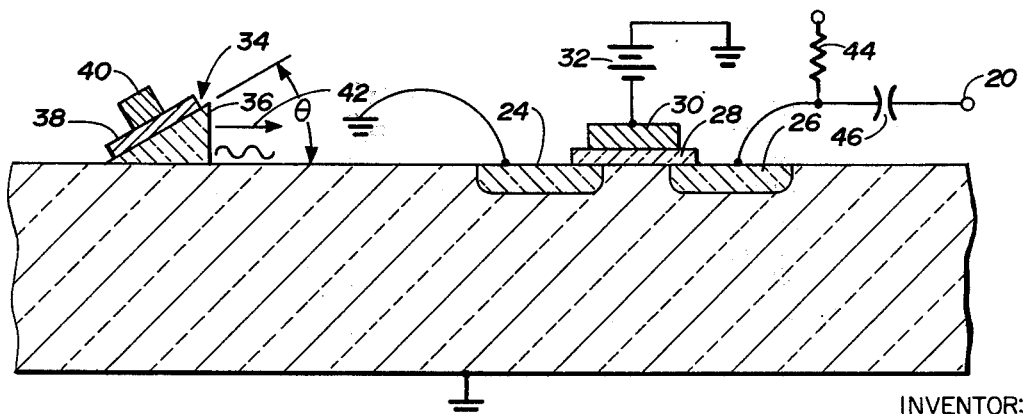
FIG. 3 is a sectional view of an elastic wave detector employing a wedge-shaped bulk wave convertor and a field-effect transistor.

Summary of Inversion Layer Piezoresistance Measurements (100) Plane $\pi_{1111} = \pi_{2222} = -1.0 \times 10^{-12}$ cm$^2$/dyne $\pi_{1122} = \pi_{2211} = 23.8 \times 10^{-12}$ cm$^2$/dyne $\pi_{1212} = \pi_{2121} = \pi_{2112} = \pi_{1221} = 63.9 \times 10^{-12}$ cm$^2$/dyne (111) Plane $\pi_{1111} = \pi_{2222} = 44.7 \times 10^{-12}$ cm$^2$/dyne $\pi_{1122} = \pi_{2211} = -15.3 \times 10^{-12}$ cm$^2$/dyne $\pi_{1212} = \pi_{2112} = \pi_{2112} = \pi_{1221} = \pi_{111} - \pi_{1122})/2 = 30.0 \times 10^{-12}$ cm$^2$/dyne (110) Plane $\pi_{1111} = -23.8 \times 10^{-12}$ cm$^2$/dyne $\pi_{2222} = 58.0 \times 10^{-12}$ cm$^2$/dyne $\pi_{1122} = 38.2 \times 10^{-12}$ cm$^2$/dyne $\pi_{2211} = -14.3 \times 10^{-12}$ cm$^2$/dyne $\pi_{1212} = \pi_{2121} = \pi_{2112} = \pi_{1221} = 33.8 \times 10^{-12}$ cm$^2$/dyne If the width of the inversion layer between the regions 12 and 14 corresponds to one-half wavelength or less for a surface wave propagating through the substrate 10, then the piezoresistance effect will modulate the number of carriers within the channel region to control current flowing between the source 12 and the drain 14. Referring to FIG. 3, there is shown an elastic wave detector wherein the piezoresistance effect on an inversion layer produces a voltage at an output terminal 20 related to a surface wave propagating through a substrate 22. The substrate 22 may be N-type silicon and the inversion layer may be generated between the source 24 and the drain 26 of a field-effect transistor. An inversion layer is generated in the substrate 22 between the drain 24 and source 26 beneath an oxide layer 28 as a result of biasing a gate electrode 30 from a DC source 32 (illustrated as a battery).

In addition to N-type silicon, the substrate 22 may be any semiconductor material that will propagate an elastic wave and in which an inversion region may be generated. Thus, although only silicon will be considered in the embodiment being described, other materials may be used, for example, germanium.

The elastic wave producing the piezoresistance change in the inversion layer between the drain 24 and source 26 is generated by a bulk wave convertor 34. The convertor 34 includes a wedge 36, a metal layer 38 and a transducer 40. The wedge 36 is shaped such that the angle $\theta$ is determined by the condition that at the surface of the substrate 22 the spacing between the compressional wavefronts is equal to that for a Rayleigh wave propagating along the surface of the substrate, i.e., sin $\theta = V_c/V_r$, where $V_c$ is the compressional velocity in the wedge 36 and $V_r$ is the Rayleigh wave velocity in the substrate. Material suitable for the wedge 36 includes plastics, such as polystyrene and chalcogenide infrared optical glass. Since the surface velocities of a propagating wave front are usually slow, the wedge 36 must be made of a material which has an extremely slow $V_c$.

A particularly useful transducer 40 for use in a bulk wave converter consists of a layer of CdS evaporated onto the contact metal layer 38 covering the upper face of the wedge 36. The contact metal layer 38 provides a ground plane and functions to match the acoustic impedance of the CdS layer 40 to the wedge 36.

In operation of the transducer illustrated in FIG. 3, a bulk wave applied to the transducer 40 is converted into a surface wave by the convertor 34 and propagates in a direction indicated by the arrow 42 toward the field-effect transistor formed in the substrate 22. The gate electrode 30 of the field-effect transistor is biased to produce an inversion layer between the drain region 24 and the source region 26, beneath the oxide layer 28, at the surface of the substrate 22. As the surface wave propagates through this inversion layer, the piezoresistance effect causes a change in current flow between the drain 24 and source 26 which produces a variation in voltage at the output terminal 20 in a circuit that includes the load resistor 44 and a coupling capacitor 46.

By properly spacing the convertor 34 from the inversion layer, a delay may be introduced between an input signal to the transducer 40 and an output signal at the terminal 20. Thus, in addition to an elastic wave detector, the configuration illustrated in FIG. 3 may also be used as a delay line in logic and other control circuitry.

In addition to be useful as single units, charge inversion regions can be arranged in a pattern for filter or decoding applications. Referring to FIG. 4, there is shown a linear arrangement of field-effect transistors 48, 50, 52 and 54 formed in a substrate 56. The gate electrode for each of the transistors illustrated is individually biased from a DC voltage source 62. A switch 64 in the connecting line to each of the gate electrodes provides for programming a particular pattern of inversion layers in the array of transistors. A bulk wave converter 58 converts an input code applied thereto into a code carrying surface wave propagating through the substrate 56 in a direction of the arrow 60. As the surface wave propagates through the pattern of transistors, it first modulates the mobility of the carriers in the inversion region for the transistor 48. Subsequently, the inversion regions of the other transistors connected to the DC supply 62 will similarly by influenced by the propagating wave.

Assume that the transistors 48, 52 and 54 are connected to the DC supply 62 and that the code carried by the surface wave appears at the first, second and fourth cycle. Then when the first code is modulating the carriers of the transistor 54, the second information bit is similarly modulating the carriers of the transistor 52 and the third information bit modulating the carriers of the transistor 48. At this time, the current between the drain and source regions of the transistors 48, 52 and 54 will be on the same order and have a predetermined relationship. This predetermined relationship of currents triggers a readout device 66 to identify the code carried by a surface wave propagating through the substrate 56.

In addition to signal decoding, a linear arrangement of transistors as illustrated in FIG. 4 also finds application as a matched filter or code correlator. Consider that a code of the type illustrated at FIG. 5A is converted by the bulk convertor 58 into a surface propagating in the direction of the arrow 60. The coded surface wave first influences the inversion region generated at the transistor 48. It continues to propagate in the direction of the arrow 60 and subsequently modulates carriers of the inversion layer of the transistor 50, now assumed to be connected to the DC source 62.

If the transistors 48 and 50 are spaced one-half wavelength apart, when the first part of the code reaches the area of the transistor 50, a subsequent portion of the code is in the area of the transistor 48. One time period later, the code will have progressed to the area of the transistor 52. At this time, as illustrated at FIG. 5B, the first pulse 68 is in the area of the transistor 52, the second pulse 70 in the area of the transistor 50, and the pulse 72 modulating the carriers of the inversion layer produced at the transistor 48. At this time the current between the source and drain regions of the transistors 48, 50 and 52 will be on the same order which can be detected and summed in the readout 66. If the readout 66 contains a visual readout, such as a cathode-ray tube or an X—Y plotter, a waveshape similar to that illustrated as FIG. 5C will be produced. The pulse 74 of the wave at FIG. 5C being a correlation of the pulses 68, 70 and 72.

Figure 6:
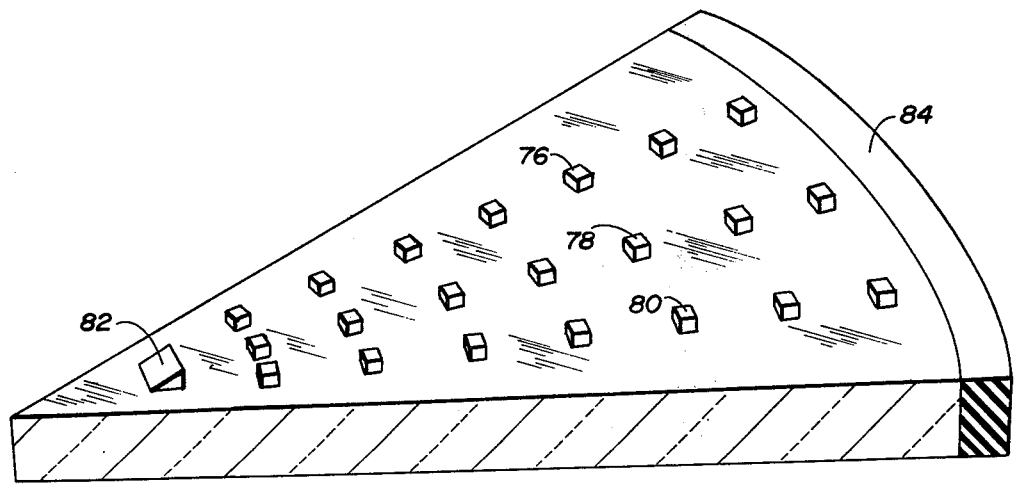
FIG. 6 is a schematic representation of a multicode, word correlator device employing multiple patterns of field-effect transistors radiating from a central hub in a radial pattern.

By other arrangements of transistors which may be programmed by selective biasing of the gate electrode to produce a pattern of inversion layers, various codes may be decoded or correlated. Referring to FIG. 6, there is shown a radial arrangement of transistors for a multicode word correlator. Each of the word correlator sections 76, 78 and 80, of the device shown, consists of arrays of field-effect transistors. At the center of the arrangement, a transducer 82 generates the code-carrying surface wave that propagates radially through the various sections.

In addition to bulk wave convertors for generating Rayleigh waves, piezoelectric excitation by electric fields at the surface of a substrate has also been used. Thus, the transducer 82 may be either a bulk wave convertor or a piezoelectric convertor.

A wave generated by the transducer 82 propagates in all directions through the various work correlator sections 76, 78 and 80. Consider that the seven digit word "1110010" is coded into a surface wave. The inversion layer pattern necessary to intercept this word is generated in one of the correlator sections by connecting selected gate electrodes to a DC supply. Thus, only one section will produce a correlated output signal when the propagating code is in a pre-established position with respect to the various field-effect transistors.

As the surface wave propagates through a substrate, some attenuation will result. By radially arranging the field-effect transistors as illustrated in FIG. 6, the transistors farthest removed from the transducer 82 may be biased to a level such that the signals from all the transistors of a given sector will be on the same order of magnitude.

To prevent reflection back through the sectors 76, 78 and 80, a wave attenuator 84 surrounds the periphery of the device. Many wave attenuators are available and a detailed description thereof is not deemed necessary. Wave attenuators may also be required for the wave detector illustrated in FIG. 3, and the decoder illustrated in FIG. 4.

Figure 7:
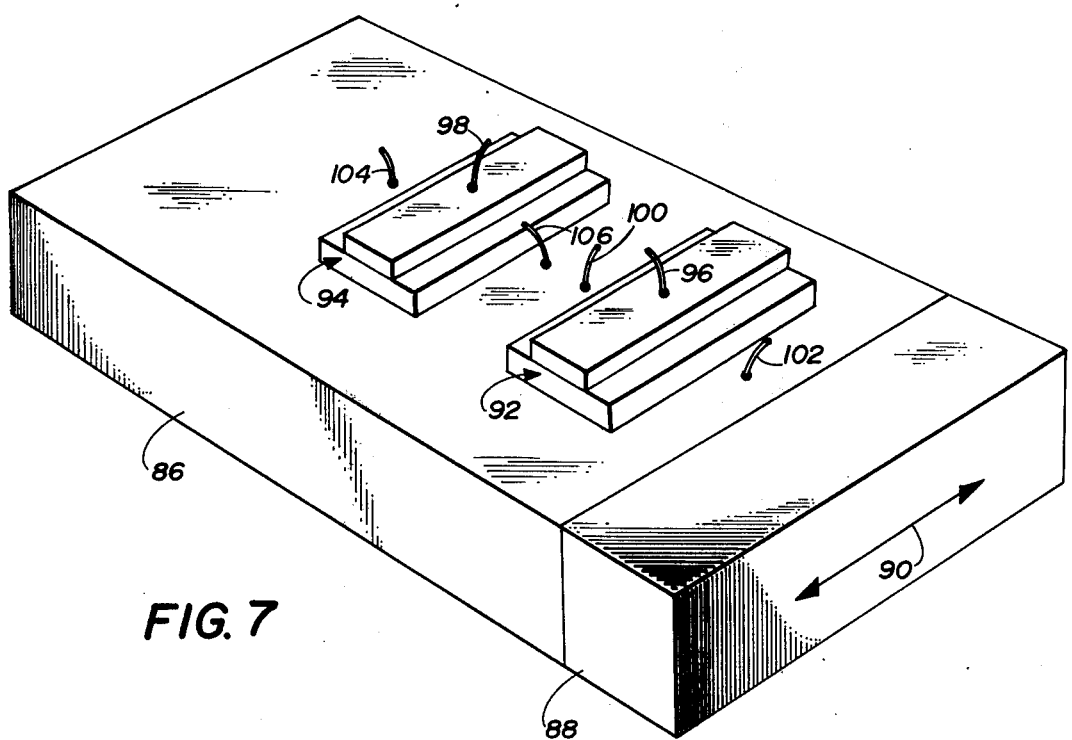
FIG. 7 is a pictorial view of an elastic wave detector for a bulk shear wave having particle displacement at the surface of a solid.

Referring to FIG. 7, there is shown an embodiment of the present invention wherein a bulk shear wave propagating through a solid produces particle displacement at the surface of the solid. A substrate 86, for example, silicon, propagates a bulk shear wave generated by a transducer 88. Any commercially available transducer may be used to generate the bulk wave in the substrate 86. This bulk wave propagates in an oscillatory type motion, as indicated by the arrow 90, and creates particle displacement at the surface of the substrate. Particle displacement at the surface of a substrate produces stress in an inversion layer between the source and drain electrode of a field-effect transistor. As illustrated, two field-effect transistors 92 and 94 are formed at the surface of the substrate 86 and produce a signal proportional to the magnitude of the particle displacement produced stress. The gate electrodes of the transistors 92 and 94 are biased by a connection of the gate leads 96 and 98, respectively, to a DC supply. An indication of the magnitude of the piezoresistance effect on the inversion layer of the transistor 92 will be generated in a circuit connected to the leads 100 and 102. Similarly, an indication of the piezoresistance effect on the inversion layer of the transistor 94 will be produced in a circuit connected to the leads 104 and 106.

Operationally, the embodiment of FIG. 7 is similar to that described previously. A bulk shear wave propagating through the substrate 86 will produce particle displacement in the inversion regions generated between the drain and source regions of the transistors 92 and 94. This particle displacement in turn causes a current change in the leads 100, 102, 104 and 106, which is a measure of the magnitude of the propagating shear wave.

Although only silicon was mentioned as a substrate material, it should be understood that other II-VI and III-V semiconductors may be used. Also, it should be understood that both N-type and P-type substrates may be used for fabricating field-effect transistors.

While the invention has been described with reference to preferred embodiments, together with modifications thereof, and shown in the accompanying drawings, it will be evident that various further modifications are possible without departing from the scope of the invention.

What is claimed is:
1. A multicode correlator comprising:
   a. a piezoresistive semiconductor substrate;
   b. means on the surface of said substrate for generating an acoustic surface wave defining a plurality of sequential components respectively corresponding to portions of a preselected coded input signal;
   c. a plurality of arrays of spaced-apart field-effect transistors defined in the surface of said substrate, each array extending radially along the surface of said substrate away from said surface wave generating means;
   d. means for selectively biasing transistors in each of said arrays to produce a preselected pattern of charge inversion layers, the pattern in each array corresponding to a preselected coded word, the minority carrier mobility in said inverted layers detectably variable responsive to an acoustic surface wave; and
   e. output means connected to each of said arrays and operably responsive to variations in minority carrier mobility, such that responsive to a coded input signal corresponding to the pattern defined by selectively biasing transistors in one of said arrays, an output signal is generated by that array when said coded surface wave propagates to a position where each of said plurality of components corresponds to a change inversion layer in said pattern.

2. A multicode word correlator as set forth in claim 1 including circuit means connected to said transistors for compensating for attenuation of the surface wave as it propagates along the surface of said substrate, said circuit means effective to insure substantially equal outputs from all of said transistors in an array responsive to a surface wave.

3. A multicode word correlator as set forth in claim 2 wherein said circuit means are effective to apply increasing larger gate bias to transistors in an array as the distance of the transistor from the surface wave generating means increases.